United States Patent
Wu et al.

(10) Patent No.: US 11,258,539 B2
(45) Date of Patent: Feb. 22, 2022

(54) TECHNOLOGIES FOR PERFORMING ENCODING OF DATA SYMBOLS FOR COLUMN READ OPERATIONS

(71) Applicant: Intel Corporation, Santa Clara, CA (US)

(72) Inventors: Wei Wu, Portland, OR (US); Sourabh Dongaonkar, Santa Clara, CA (US); Jawad Khan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/867,638

(22) Filed: May 6, 2020

(65) Prior Publication Data

US 2020/0266929 A1    Aug. 20, 2020

(51) Int. Cl.
    *H04L 1/00*           (2006.01)
    *H04L 1/06*           (2006.01)
    *H03M 13/11*        (2006.01)

(52) U.S. Cl.
CPC ....... *H04L 1/0064* (2013.01); *H03M 13/1102* (2013.01); *H04L 1/0041* (2013.01); *H04L 1/0071* (2013.01); *H04L 1/0643* (2013.01)

(58) Field of Classification Search
CPC ... H04L 1/0041; H04L 1/0064; H04L 1/0071; H04L 1/0643; H03M 13/1102; H03M 13/2921; H03M 13/31; H03M 13/05
See application file for complete search history.

(56) References Cited

U.S. PATENT DOCUMENTS

2014/0237316 A1* 8/2014 Tantos ................... H03M 5/145
                                                                              714/758
2016/0336969 A1* 11/2016 Bhatia ............... H03M 13/2921

OTHER PUBLICATIONS

Xu et al., Modeling and design analysis of 3D Vertical resistive memory—A low cost cross point architecture, IEEE, pp. 825 to 830. (Year: 2014).*

Lou et al., 3DICT: A reliable and Qos capable mobile process-in memory architecture for lookup-based CNNs in 3D XPoint ReRAMs, IEEE, pp. 1 to 8 (Year: 2018).*

* cited by examiner

*Primary Examiner* — Shelly A Chase
(74) *Attorney, Agent, or Firm* — Compass IP Law PC

(57) ABSTRACT

Technologies for performing encoding of data symbols for column read operations include a device having a memory that is column addressable and circuitry connected to the memory. The circuitry is configured to obtain a data set to encode. The data set is defined by a set of data symbols. The circuitry is also configured to determine a set of codewords to encode the data symbols of the data set, including defining each codeword with a set bit distance of at least two from every other codeword in the set of codewords. Additionally, the circuitry is configured to write the data set to the memory as a function of the determined set of codewords.

19 Claims, 10 Drawing Sheets

| | |
|---|---|
| A: ____ 11 __ | N: __ 1 1 ____ |
| B: 1 __ __ 1 ___ | O: ____ __11 |
| C: ___ 1 _1 __ | P: ____ 1 _ 1 |
| D: _1_1 ____ | Q: ___ 1 ___ 1 |
| E: 11 __ ____ | R: 1_1_ _ ____ |
| F: _1 __ 1 __ | S: ____ _11_ |
| G: __ 1 _ _1 __ | T: __ 11 ____ |
| H: 1 ___ ___ 1 | U: ____ 1_1_ |
| I: _11_ _ ____ | V: _1 __ _1 __ |
| J: 1 ___ __ 1 _ | W: 1 __ 1 ____ |
| K: __ 1 __ __ 1_ | X: _1 __ ___ 1 |
| L: __ 1_ 1 ___ | Y: ___ 1 _ 1_ |
| M: ____ _1_1 | Z: _1 __ __ 1_ |

FIG. 6

TECHNOLOGIES FOR PERFORMING ENCODING OF DATA SYMBOLS FOR COLUMN READ OPERATIONS

BACKGROUND

The encoding of data symbols (e.g., symbols that alone or in combination define a set of data, such as letters, numbers, etc.) is typically measured in terms of the code length and the bit weight used to encode the data symbols. The code length, L, defines the number of bits for each data symbol. The larger the code length, the more storage overhead is required to store a set of data symbols in memory. The bit weight, W, defines the number of bits that are set (e.g., to one) within the code length to define a given data symbol. Typical data symbol encoding schemes are established based on the assumption that the encoded data will be accessed in rows, as typical memory architectures enable specific rows of data to be accessed (e.g., read), but not specific columns (e.g., individual bits).

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

FIG. 6 is a diagram of an encoding of data symbols using codewords having a set bit distance of at least two that may be produced by the compute device of FIG. 1;

DETAILED DESCRIPTION OF THE DRAWINGS

Figure 1:
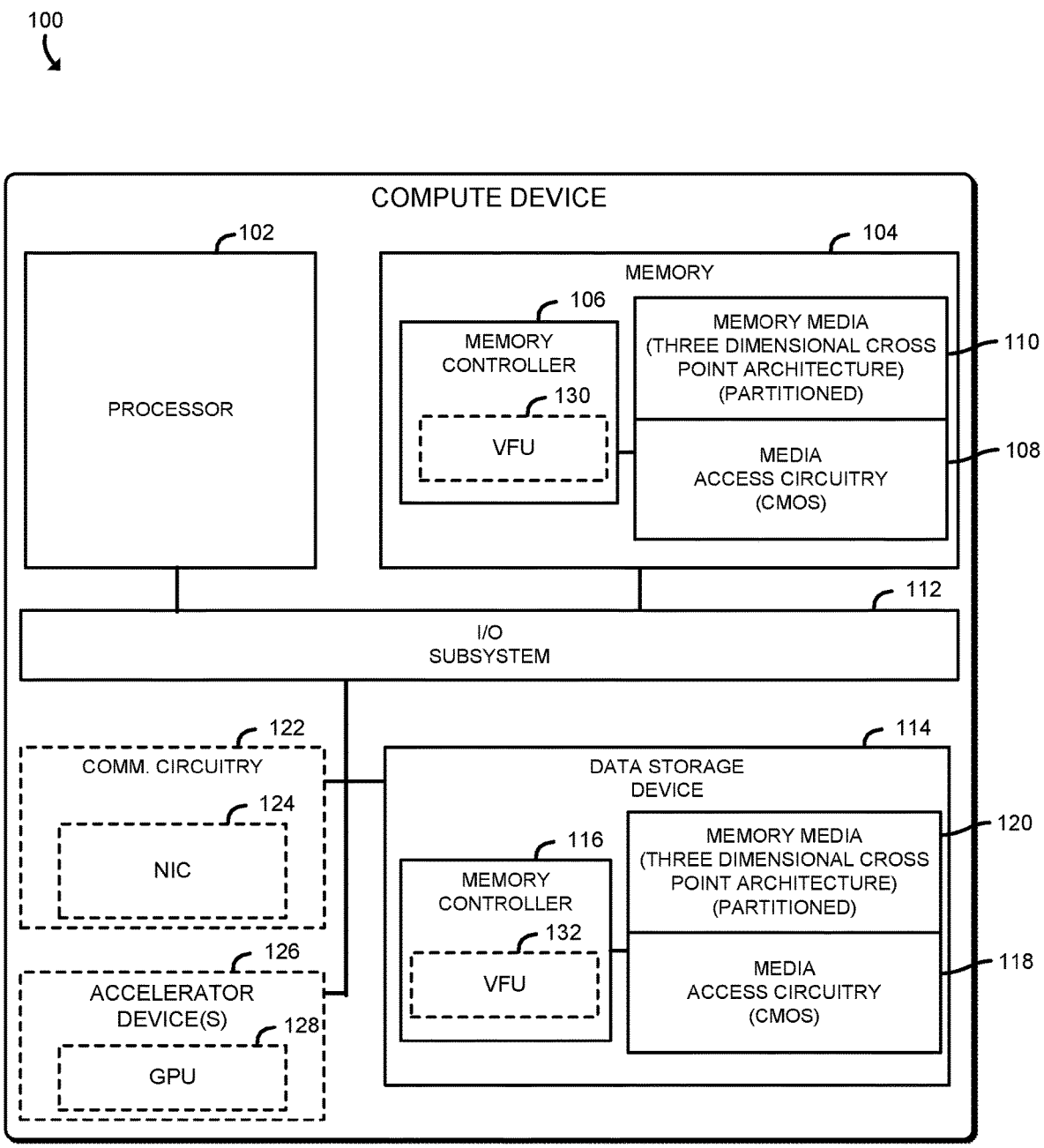
FIG. 1 is a simplified diagram of at least one embodiment of a compute device for performing encoding of data symbols for column read operations on a column addressable memory.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Referring now to FIG. 1, a compute device 100 for performing encoding of data symbols for column read operations using a column-read enabled memory includes a processor 102, a memory 104, an input/output (I/O) subsystem 112, a data storage device 114, communication circuitry 122, and one or more accelerator devices 126. Of course, in other embodiments, the compute device 100 may include other or additional components, such as those commonly found in a computer (e.g., a display, peripheral devices, etc.). Additionally, in some embodiments, one or more of the illustrative components may be incorporated in, or otherwise form a portion of, another component. The term "memory," as used herein in reference to performing data symbol encoding, may refer to the memory 104 and/or the data storage device 114, unless otherwise specified. As explained in more detail herein, media access circuitry 108, 118 (e.g., any circuitry or device configured to access and operate on data in the corresponding memory media 110, 120) connected a corresponding memory media 110, 120 (e.g., any device or material that data is written to and read from) may access (e.g., read) individual columns (e.g., bits) of rows of data (e.g., vectors), such as for use in performing similarity searches, also referred to as "stochastic associative searches" (SAS). As such, the memory may operate as a "stochastic associative memory" (e.g., is designed to enable the efficient performance of stochastic associative searches).

The memory media 110, in the illustrative embodiment, has a three dimensional cross point architecture that has data access characteristics that differ from other memory architectures (e.g., dynamic random access memory (DRAM)), such as enabling access to one bit per tile and incurring time delays between reads or writes to the same partition or other partitions. The media access circuitry 108 is configured to make efficient use (e.g., in terms of power usage and speed) of the architecture of the memory media 110, such as by accessing multiple tiles in parallel within a given partition. In some embodiments, the media access circuitry 108 may utilize scratch pads (e.g., relatively small, low latency memory) to temporarily retain and operate on data read from the memory media 110 and broadcast data read from one partition to other portions of the memory 104 to enable calculations (e.g., matrix operations) to be performed in parallel within the memory 104. Additionally, in the illustrative embodiment, instead of sending read or write requests to the memory 104 to access matrix data, the processor 102 may send a higher-level request (e.g., a request for a macro operation, such as a request to return a set of N search results based on a search key). As such, many compute operations, such as artificial intelligence operations (e.g., stochastic associative searches) can be performed in memory (e.g., in the memory 104 or in the data storage device 114), with minimal usage of the bus (e.g., the I/O subsystem 112) to transfer data between components of the compute device 100 (e.g., between the memory 104 or data storage device 114 and the processor 102).

In some embodiments the media access circuitry 108 is included in the same die as the memory media 110. In other embodiments, the media access circuitry 108 is on a separate die but in the same package as the memory media 110. In yet other embodiments, the media access circuitry 108 is in a separate die and separate package but on the same dual in-line memory module (DIMM) or board as the memory media 110.

The processor 102 may be embodied as any device or circuitry (e.g., a multi-core processor(s), a microcontroller, or other processor or processing/controlling circuit) capable of performing operations described herein, such as executing an application (e.g., an artificial intelligence related application that may utilize stochastic associative searches). In some embodiments, the processor 102 may be embodied as, include, or be coupled to a field-programmable gate array (FPGA), an application specific integrated circuit (ASIC), reconfigurable hardware or hardware circuitry, or other specialized hardware to facilitate performance of the functions described herein.

The memory 104, which may include a non-volatile memory (e.g., a far memory in a two-level memory scheme), includes the memory media 110 and the media access circuitry 108 (e.g., a device or circuitry, such as a processor, application specific integrated circuitry (ASIC), or other integrated circuitry constructed from complementary metal-oxide-semiconductors (CMOS) or other materials) underneath (e.g., at a lower location) and coupled to the memory media 110. The media access circuitry 108 is also connected to the memory controller 106, which may be embodied as any device or circuitry (e.g., a processor, a co-processor, dedicated circuitry, etc.) configured to selectively read from and/or write to the memory media 110 in response to corresponding requests (e.g., from the processor 102 which may be executing an artificial intelligence related application that relies on stochastic associative searches to recognize objects, make inferences, and/or perform related artificial intelligence operations). In some embodiments, the memory controller 106 may include a vector function unit (VFU) 130 which may be embodied as any device or circuitry (e.g., dedicated circuitry, reconfigurable circuitry, an application specific integrated circuit (ASIC), a field programmable gate array (FPGA), etc.) capable of offloading vector-based tasks from the processor 102 (e.g., comparing data read from specific columns of vectors stored in the memory media 110, determining Hamming distances between the vectors stored in the memory media 110 and a search key, sorting the vectors according to their Hamming distances, etc.).

Figure 2:
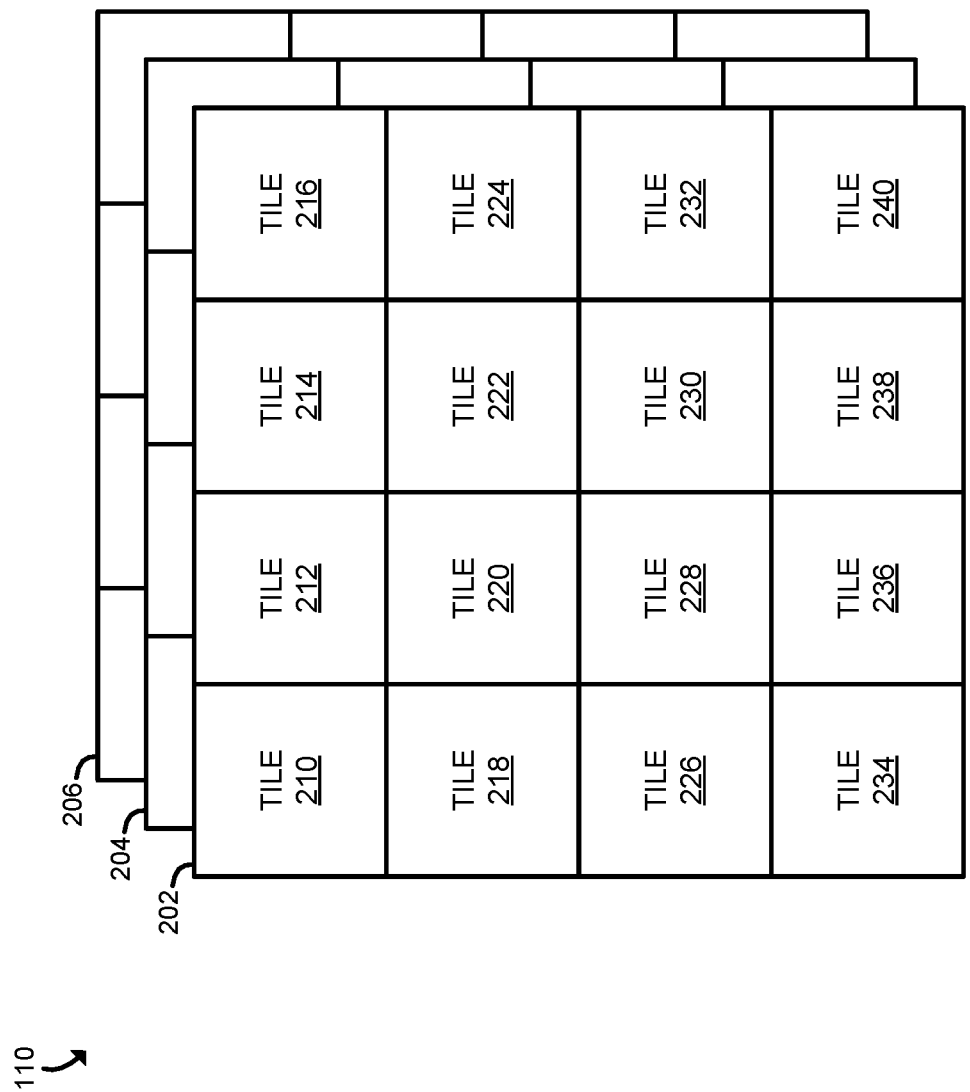
FIG. 2 is a simplified diagram of at least one embodiment of a memory media included in the compute device of FIG. 1.

Referring briefly to FIG. 2, the memory media 110, in the illustrative embodiment, includes a tile architecture, also referred to herein as a cross point architecture (e.g., an architecture in which memory cells sit at the intersection of word lines and bit lines and are individually addressable and in which bit storage is based on a change in bulk resistance), in which each memory cell (e.g., tile) 210, 212, 214, 216, 218, 220, 222, 224, 226, 228, 230, 232, 234, 236, 238, 240 is addressable by an x parameter and a y parameter (e.g., a column and a row). The memory media 110 includes multiple partitions, each of which includes the tile architecture. The partitions may be stacked as layers 202, 204, 206 to form a three dimensional cross point architecture (e.g., Intel 3D XPoint™ memory). Unlike typical memory devices, in which only fixed-size multiple-bit data structures (e.g., byte, words, etc.) are addressable, the media access circuitry 108 is configured to read individual bits, or other units of data, from the memory media 110 at the request of the memory controller 106, which may produce the request in response to receiving a corresponding request from the processor 102.

Referring back to FIG. 1, the memory 104 may include non-volatile memory and volatile memory. The non-volatile memory may be embodied as any type of data storage capable of storing data in a persistent manner (even if power is interrupted to the non-volatile memory). For example, the non-volatile memory may be embodied as one or more non-volatile memory devices. The non-volatile memory devices may include one or more memory devices configured in a cross point architecture that enables bit-level addressability (e.g., the ability to read from and/or write to individual bits of data, rather than bytes or other larger units of data), and are illustratively embodied as three dimensional (3D) cross point memory. In some embodiments, the non-volatile memory may additionally include other types of memory, including any combination of memory devices that use chalcogenide phase change material (e.g., chalcogenide glass), ferroelectric transistor random-access memory (FeTRAM), nanowire-based non-volatile memory, phase change memory (PCM), memory that incorporates memristor technology, Magnetoresistive random-access memory (MRAM) or Spin Transfer Torque (STT)-MRAM. The volatile memory may be embodied as any type of data storage capable of storing data while power is supplied volatile memory. For example, the volatile memory may be embodied as one or more volatile memory devices, and is periodically referred to hereinafter as volatile memory with the understanding that the volatile memory may be embodied as other types of non-persistent data storage in other embodiments. The volatile memory may have an architecture that enables bit-level addressability, similar to the architecture described above.

The processor 102 and the memory 104 are communicatively coupled to other components of the compute device 100 via the I/O subsystem 112, which may be embodied as circuitry and/or components to facilitate input/output operations with the processor 102 and/or the main memory 104 and other components of the compute device 100. For example, the I/O subsystem 112 may be embodied as, or otherwise include, memory controller hubs, input/output control hubs, integrated sensor hubs, firmware devices, communication links (e.g., point-to-point links, bus links, wires, cables, light guides, printed circuit board traces, etc.), and/or other components and subsystems to facilitate the input/output operations. In some embodiments, the I/O subsystem 112 may form a portion of a system-on-a-chip (SoC) and be incorporated, along with one or more of the processors 102, the main memory 104, and other components of the compute device 100, in a single chip.

The data storage device 114 may be embodied as any type of device configured for short-term or long-term storage of data such as, for example, memory devices and circuits, memory cards, hard disk drives, solid-state drives, or other data storage device. In the illustrative embodiment, the data storage device 114 includes a memory controller 116, similar to the memory controller 106, memory media 120 (also referred to as "storage media"), similar to the memory media 110, and media access circuitry 118, similar to the media access circuitry 108. Further, the memory controller 116 may also include a vector function unit (VFU) 132 similar to the vector function unit (VFU) 130. The data storage device 114 may include a system partition that stores data and firmware code for the data storage device 114 and one or more operating system partitions that store data files and executables for operating systems.

The communication circuitry 122 may be embodied as any communication circuit, device, or collection thereof, capable of enabling communications over a network between the compute device 100 and another device. The communication circuitry 122 may be configured to use any one or more communication technology (e.g., wired or wireless communications) and associated protocols (e.g., Ethernet, Bluetooth®, Wi-Fi®, WiMAX, etc.) to effect such communication.

The illustrative communication circuitry 122 includes a network interface controller (NIC) 124, which may also be referred to as a host fabric interface (HFI). The NIC 124 may be embodied as one or more add-in-boards, daughter cards, network interface cards, controller chips, chipsets, or other devices that may be used by the compute device 100 to connect with another compute device. In some embodiments, the NIC 124 may be embodied as part of a system-on-a-chip (SoC) that includes one or more processors, or included on a multichip package that also contains one or more processors. In some embodiments, the NIC 124 may include a local processor (not shown) and/or a local memory (not shown) that are both local to the NIC 124. In such embodiments, the local processor of the NIC 124 may be capable of performing one or more of the functions of the processor 102. Additionally or alternatively, in such embodiments, the local memory of the NIC 124 may be integrated into one or more components of the compute device 100 at the board level, socket level, chip level, and/or other levels. The one or more accelerator devices 126 may be embodied as any device(s) or circuitry capable of performing a set of operations faster than the general purpose processor 102. For example, the accelerator device(s) 126 may include a graphics processing unit 128, which may be embodied as any device or circuitry (e.g., a co-processor, an ASIC, reconfigurable circuitry, etc.) capable of performing graphics operations (e.g., matrix operations) faster than the processor 102.

Figure 3:
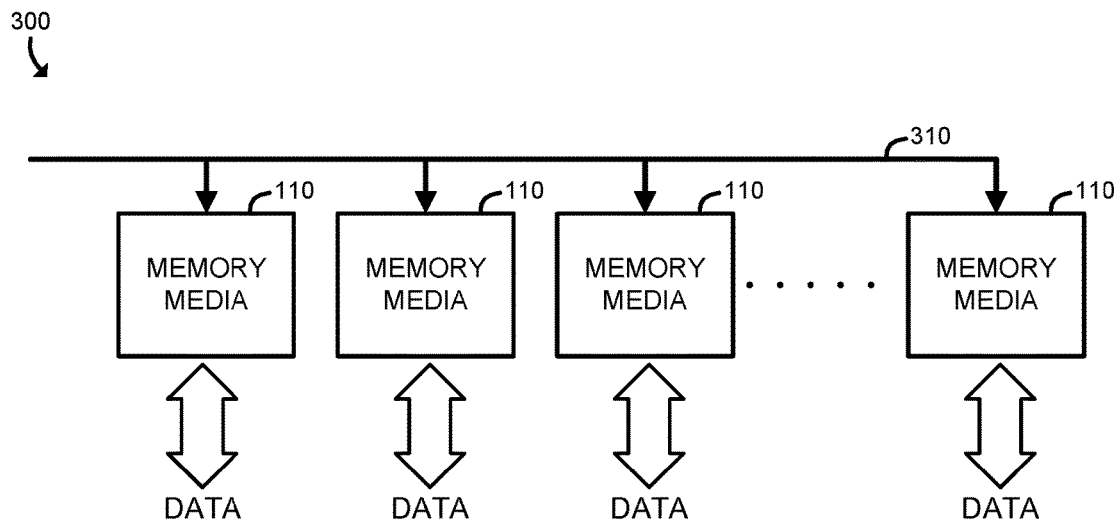
FIG. 3 is a simplified diagram of at least on embodiment of the memory media of the compute device of FIG. 1 in a dual in-line memory module (DIMM)

Referring now to FIG. 3, the compute device 100, in some embodiments, may utilize a dual in-line memory module (DIMM) architecture 300. In the architecture 300, multiple dies of the memory media 110 are connected with a shared command address bus 310. As such, in operation, data is read out in parallel across all of the memory media 110 connected to the shared command address bus 310. Data may be laid out across the memory media 110 in a configuration to allow reading the same column across all of the connected dies of the memory media 110.

Figure 4:
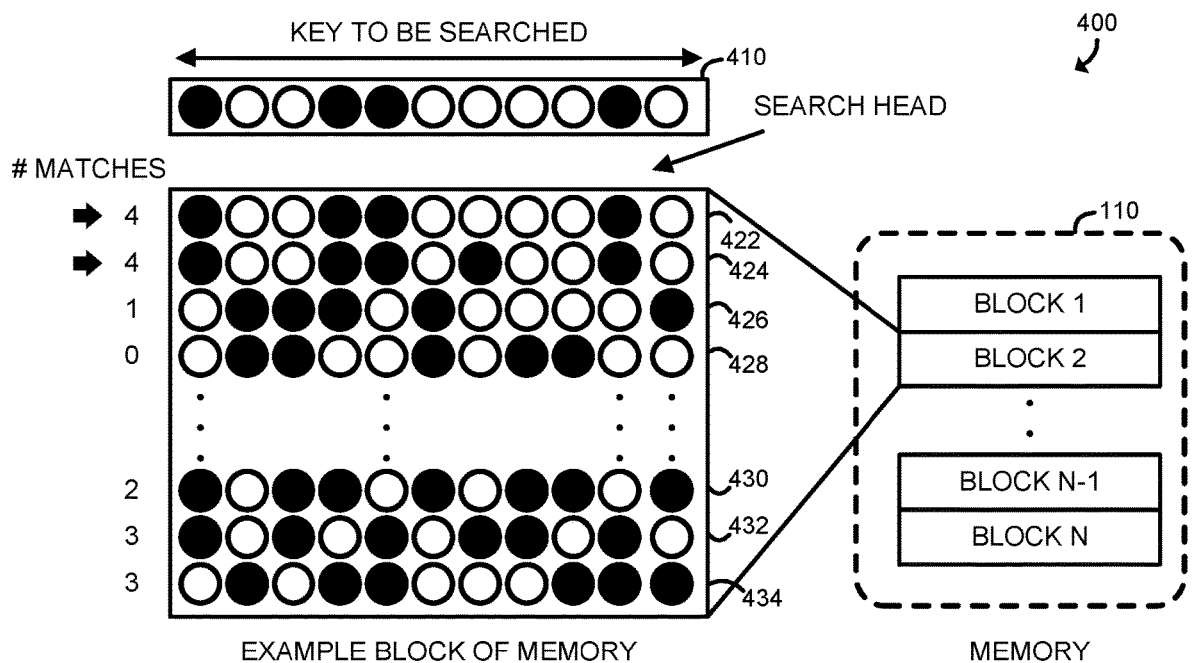
FIG. 4 is a simplified diagram of a stochastic associative search (SAS) performed using a search key on the memory media of FIGS. 1-3.

Referring now to FIG. 4, the compute device 100 may perform a stochastic associative search 400, which is a highly efficient and fast way of searching through a large database of records and finding similar records to a given query record (key). For simplicity and clarity, stochastic associative searches 400, data symbol encoding, and other processes are described herein as being performed with the memory 104. However, it should be understood that the processes could alternatively or additionally be performed with the storage device 114, depending on the particular embodiment. Given that the memory media 110 allows both row and column-wise reads with similar read latency, the memory media 110 is particularly suited to enabling efficient stochastic associative searches. As described in more detail herein, the format used by the compute device 100 to encode and subsequently access data symbols (e.g., letters, numbers, etc.) in the memory media 110 is designed to take advantage of the column addressability of the memory. In performing a search, columns (e.g., bits) within the search key 410 are compared to the corresponding columns (e.g., bits) in the database elements (e.g., vectors) 422, 424, 426, 428, 430, 432, 434 stored in the blocks of the memory media 110. The compute device 100 determines the number of matching values between the search key 410 and each database element (e.g., vector), which is representative of a Hamming distance between the search key 410 and each database element (e.g., vector). The database elements (e.g., vectors) having the lowest Hamming distances are the most similar results (e.g., the result set) for the stochastic associative search 400.

In encoding data symbols in the column addressable memory, the compute device 100, in the illustrative embodiment, utilizes an encoding scheme that is relatively small in codeword size, relatively fast in query time, and self-correctable when errors occur. Two basic metrics upon which the encoding scheme is based are the length, L, of a codeword used to encode a data symbol, and the bit weight, W, for each codeword. The length, L, defines the number of bits in the codeword used to encode a data symbol. The larger the length, the more storage overhead is needed to store the codeword. The bit weight represents the number of bits that are set (e.g., to one) for a given codeword used to encode a data symbol. The bit weight controls how many columns of the memory will be read (e.g., to identify what data symbol a codeword corresponds to). The larger the bit weight per codeword, the longer the query time. As such, reducing the bit weight provides faster performance for queries.

Figure 5:
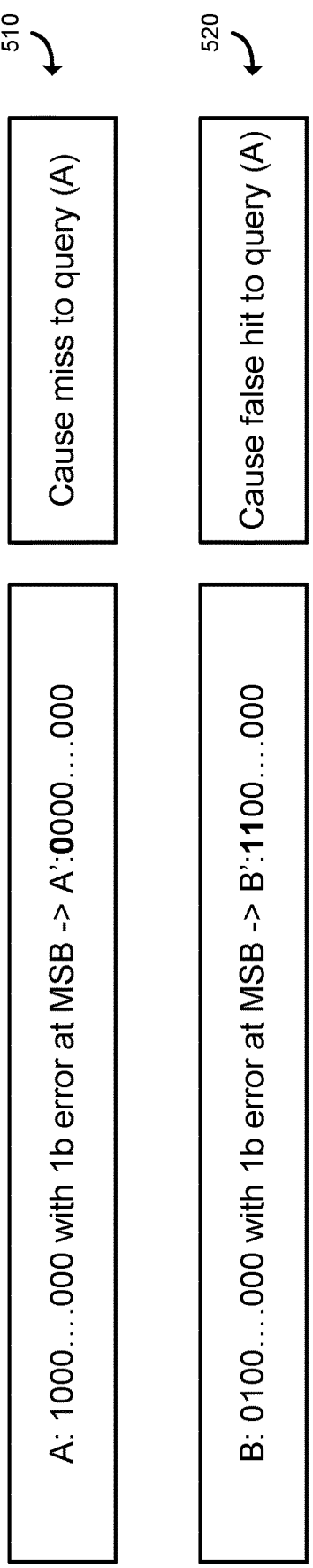
FIG. 5 is a diagram of an encoding of data symbols using codewords having one unique bit set per codeword that may be produced by the compute device of FIG. 1.

One aspect of an embodiment of an encoding scheme that may be utilized by the compute device 100 is that each codeword has at least one unique set bit. Having at least one unique set bit per codeword guarantees that each codeword can be uniquely identified through all and only set bits. For example, if A is encoded as 000111 and B is encoded as 000011 then B has no unique 1's compared to A. That is, a query for B will return A as well. The compute device 100, in some embodiments, may utilize a "1-hot" encoding scheme in which each codeword has one and only one set bit. Such an encoding scheme enables fast queries, as only one column (e.g., the position of the set bit) would need to be queried to determine whether a given codeword corresponding to a particular data symbol is present (e.g., at the queried memory location). However, having a single set bit in a codeword requires that the codewords be equal to the size of the set of data symbols that are to be encoded (e.g., 26 bits to encode a letter of the English alphabet). Additionally, as shown in FIG. 5, the accuracy (e.g., resistance to errors) is relatively poor, as a single erroneous bit flip (e.g., from 1 to 0 or 0 to 1) may cause a false negative or a false positive. As shown in the example 510, a one-bit error in a most significant bit of a codeword may cause a false negative (a miss) for a query of the codeword to determine whether the codeword corresponds to the letter A. Conversely, as shown in the example 520, a false positive (a false hit) may occur if the most significant bit of the codeword that should represent the letter B is flipped to 1 (rather than 0).

Another aspect of the illustrative encoding scheme is that the set bit distance between any two codewords is at least two. The definition of the set bit distance between the codewords for two data symbols (e.g., A and B) is the number of bits that are set in one codeword (e.g., the codeword for A) but not the other codeword (e.g., the codeword for B). For example, the set bit distance between 1111 and 0000 is four, while the set bit distance between 0000 and 1111 is zero. The set bit distance between any "1-hot" codeword is only one. As such, any single bit flip from 0 to 1 may cause a false result. Increasing the set bit distance creates an error buffer zone between two different codewords, such that more erroneous bits (e.g., more than one) must be present in a codeword to produce a miss (e.g., example 510 of FIG. 5) or false hit (e.g., example 520 of FIG. 5). Referring now to FIG. 6, the compute device 100 may utilize a set of codewords 600 for encoding the English alphabet. The codewords 600 have a length of eight bits and a bit weight of two. The bit weight is higher than that of the 1-hot code and the set bit distance is greater. For example, the distance between the codeword for A and the codeword for D is two. The minimum Hamming distance is two, which means any one bit error (e.g., an erroneous bit flip) can be detected by the compute device 100.

In some embodiments, the compute device 100 may utilize an encoding scheme in which a base codeword is repeated (e.g., concatenated with itself) at least once, to increase reliability (e.g., the ability to correctly identify what data symbol a codeword corresponds to when one or more erroneous bit flips have occurred). Doing so also increases Hamming distances between codewords for different data symbols. For example, using the encoding scheme shown in FIG. 6, if the codewords are repeated (e.g., the codeword for A is concatenated with itself, the codeword for B is concatenated with itself, etc.), then the minimum Hamming distance between any two codewords is four, rather than two. In effect, repeating each codeword is equivalent to producing a single-error correct and double-error detect code. As a result, each individual letter in the encoding scheme can tolerate one bit of error and still be read correctly, potentially obviating the need for additional error correction code (ECC) protection in the memory. In some embodiments, ECC protection may still be applied to provide additional robustness. Further, the degree of granularity for ECC protection may vary from embodiment to another. For example, an ECC codeword may be produced for every thirty two symbols (e.g., letters) or a different number of symbols.

Figure 7:
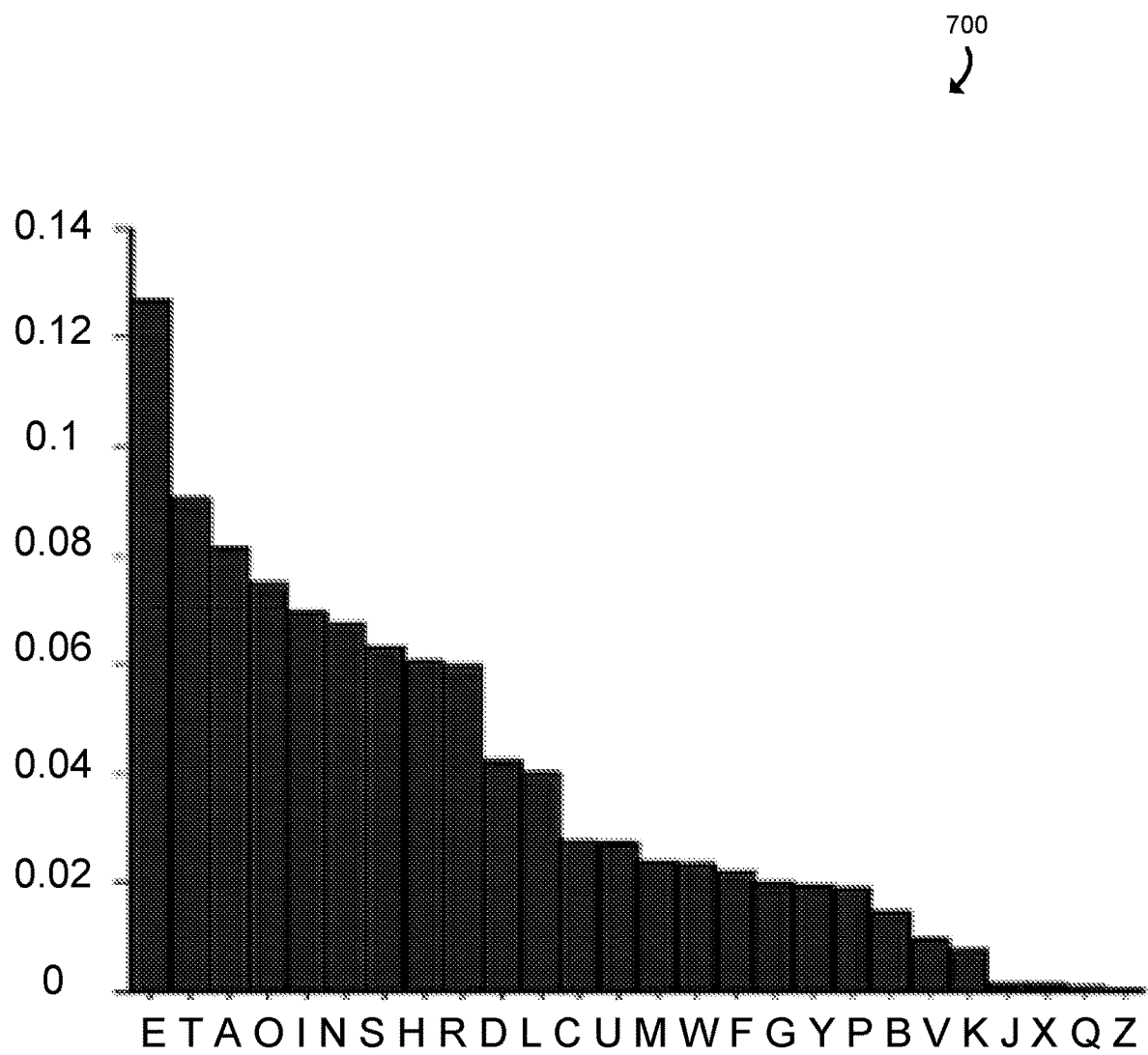
FIG. 7 is a graph indicative of a frequency of use of data symbols in a data set that may be used by the compute device of FIG. 1 to encode the data symbols.

The compute device 100, in some embodiments may base the encoding scheme on the frequency with which each data symbol is used in a data set. Referring now to the graph 700 of FIG. 7, in the English alphabet, not all of the data symbols (e.g., letters) are used at the same frequency. For example, the letters A, O, E, and T are used more often than others. The compute device 100, in some embodiments, may define the codewords to have a larger set bit distance between the more frequently used data symbols compared to less frequently used data symbols in a given data set, to reduce the likelihood that the compute device 100 will obtain an erroneous result when performing a query of the data set for a given data symbol.

Figure 8:
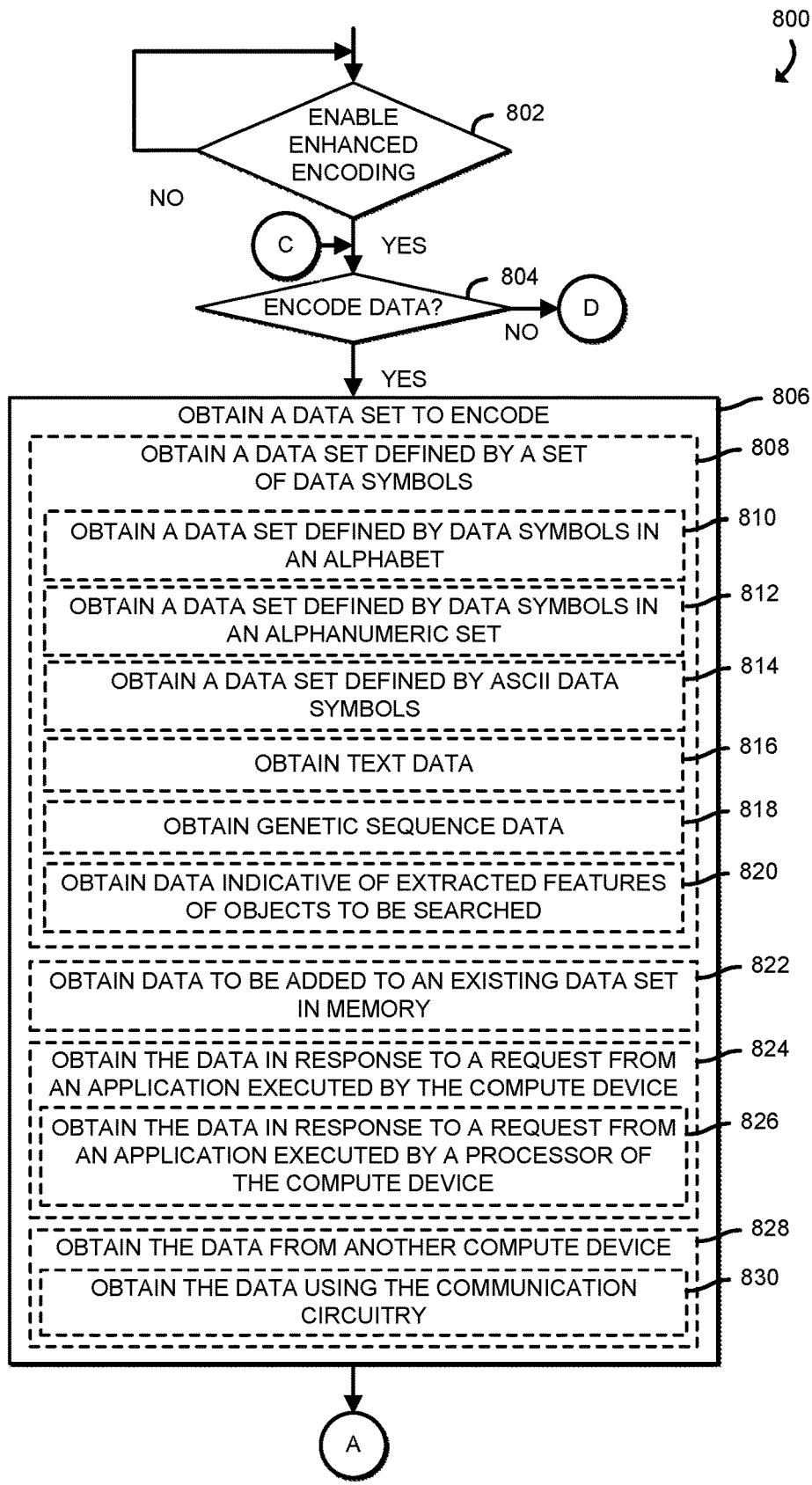
FIGS. 8-11 are flow diagrams of at least one embodiment of a method for performing enhanced encoding of data symbols for column read operations that may be performed by the compute device of FIG. 1.

Referring now to FIG. 8, the compute device 100, in operation, may execute a method 800 for performing enhanced encoding of data symbols for a column addressable memory (e.g., the memory 104). The method 800 begins with block 802 in which the compute device 100 determines whether to enable enhanced encoding. In doing so, the compute device 100 may determine to enable enhanced encoding in response to a determination that the compute device 100 is equipped with column addressable memory (e.g., the memory 104), in response to determining that a configuration setting (e.g., in a configuration file) indicates to enable enhanced encoding, and/or based on other factors. Regardless, in response to a determination to enable enhanced encoding, the method 800 advances to block 804, in which the compute device 100 determines whether encode a set of data. In doing so, the compute device 100 may determine to encode a set of data in response to receiving a request to do so (e.g., from an application executed by the processor 102, by another compute device (not shown) in communication with the compute device 100 through the communication circuitry 122, etc.). Regardless, in response to a determination to encode a set of data, the method 800 advances to block 806 in which the compute device 100 obtains a data set to encode. In doing so, and as indicated in block 808, the compute device 100 obtains a data set defined by (e.g., constituted by) a set of data symbols. For example, the compute device 100 may obtain a data set defined by data symbols in an alphabet (e.g., the letters of the English alphabet), as indicated in block 810. In some embodiments, the compute device obtains a data set defined by data symbols in an alphanumeric set (e.g., letters and numbers), as indicated in block 812. The compute device 100, in some embodiments, obtains a data set defined by American Standard Code for Information Interchange (ASCII) data symbols, as indicated in block 814. In some embodiments, the compute device 100 obtains text data (e.g., the data set is text), as indicated in block 816. As indicated in block 818, the compute device 100, in obtaining the data set, may obtain genetic sequence data (e.g., sequences of the letters A, T, C, and G corresponding to the nitrogenous bases: adenine, guanine, cytosine, and thymine). In other embodiments, the compute device 100 may obtain a data set indicative of extracted features (e.g., size, color, etc.) of objects to be searched, as indicated in block 820.

In some embodiments, the compute device 100 may obtain data to be added to an existing data set in memory (e.g., the memory 104), such as adding a set of records to an already-existing database, as indicated in block 822. As indicated in block 824, the compute device 100 may obtain the data in response to a request from an application executed by the compute device 100. For example, and as indicated in block 826, the compute device 100 may obtain the data in response to a request from an application executed by the processor 102 of the compute device 100. In some embodiments, the compute device 100 may obtain the data to be encoded from another compute device (not shown), as indicated in block 828. In doing so, the compute device 100 may obtain the data using the communication circuitry 122, as indicated in block 830. Subsequently, the method 800 advances to block 832 of FIG. 9, in which the compute device 100 determines a frequency of use of each data symbol in the data set.

Figure 9:
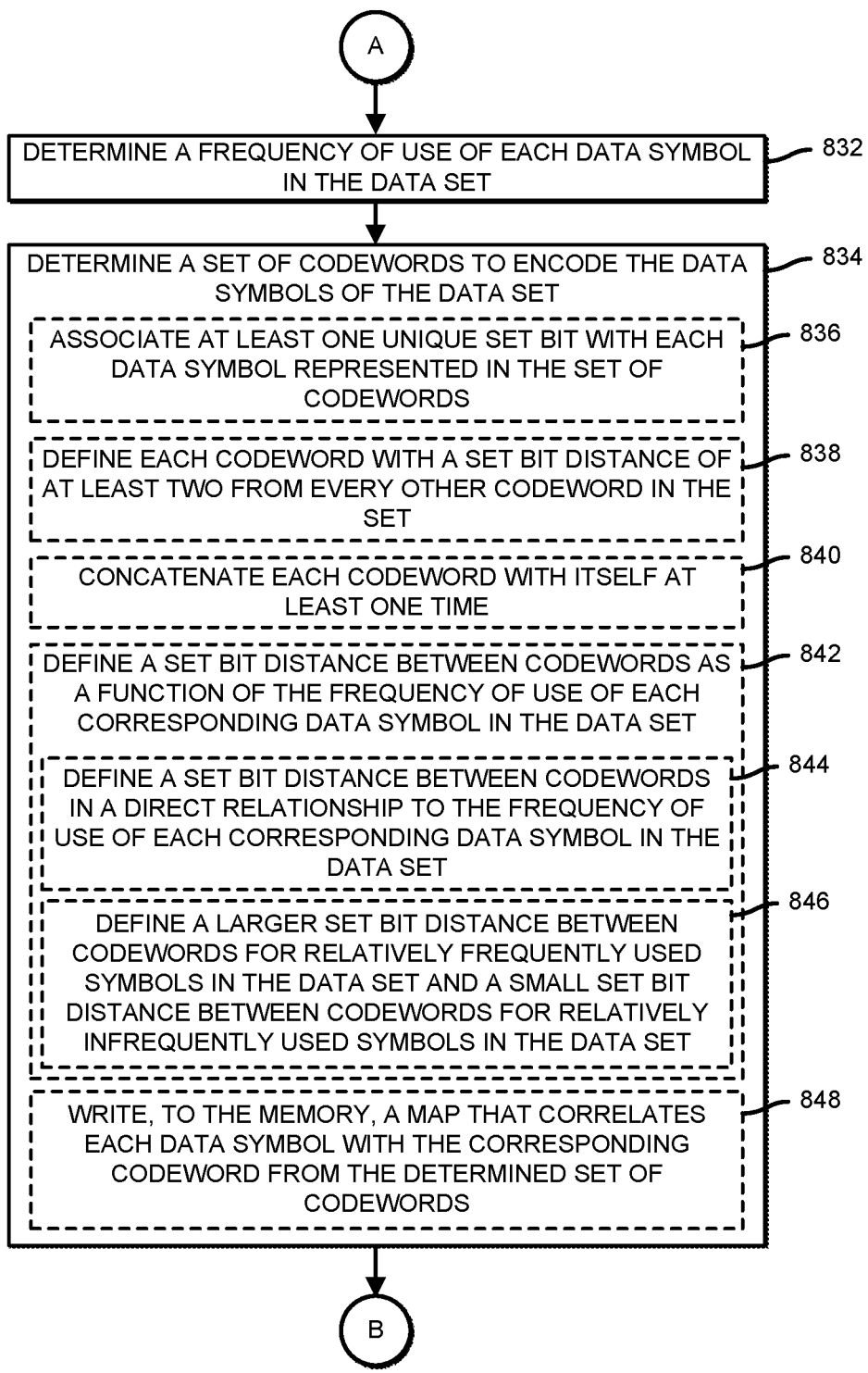

Referring now to FIG. 9, after the compute device 100 has determined the frequency of use of each data symbol in the data set, the method 800 advances to block 834, in which the compute device 100 determines a set of codewords to encode the data symbols (e.g., letters, numbers, etc.) of the data set (e.g., obtained in block 806). In doing so, and as indicated in block 836, the compute device 100 may associate at least one unique set bit with each data symbol represented in the set of codewords. As indicated in block 838, in some embodiments, the compute device 100 may defined each codeword with a set bit distance of at least two from every other codeword in the set (e.g., as shown in the set of codewords 600 of FIG. 6). In some embodiments, to increase Hamming distance between codewords, the compute device 100 may concatenate each codeword with itself at least one time, as indicated in block 840. In block 842, the compute device 100 may define a set bit distance between codewords as a function of the frequency of use of each corresponding data symbol in the data set. In doing so, and as indicated in block 844, the compute device 100 may define a set bit distance between codewords in a direct relationship to the frequency of use of each corresponding data symbol in the data set. As indicated in block 846, the compute device 100 may define a larger set bit distance between codewords for relatively frequently used data symbols in the data set and a relatively small set bit distance between codewords for relatively infrequently used data symbols in the data set. In block 848, the compute device 100 may write, to the memory (e.g., the memory 104), a map which may be embodied as any data structure that correlates each data symbol with the corresponding codeword from the determined set of codewords (e.g., determined according to block 834). Subsequently, the method 800 advances to block 850 of FIG. 10, in which the compute device 100 writes the data set to the memory as a function of the determined set of codewords.

Figure 10:
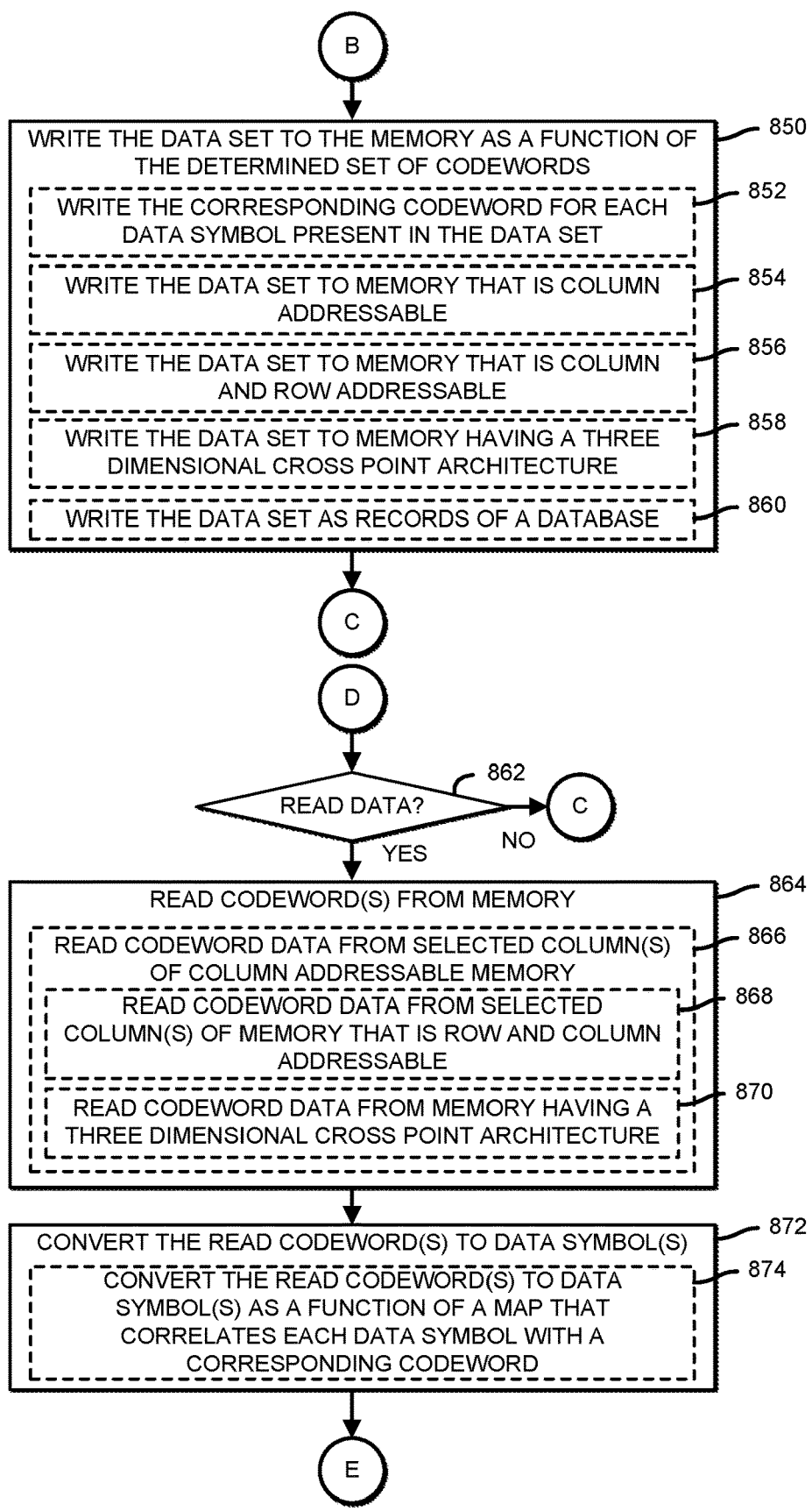

Referring now to FIG. 10, in writing the data set to the memory, the compute device 100 writes the corresponding codeword for each data symbol present in the data set (e.g., writing the determined codeword for the letter A for every instance of A in the data set, etc.), as indicated in block 852. As indicated in block 854, in the illustrative embodiment, the compute device 100 writes the data set (e.g., using the codewords) to memory that is column addressable. In the illustrative embodiment, and as indicated in block 856, the compute device 100 writes the data set (e.g., using the codewords) to memory that is both column and row addressable. As indicated in block 858, the compute device 100 writes the data set (e.g., using the codewords) to memory having a three dimensional cross point architecture. In some embodiments, the compute device 100 writes the data set as records of a database, as indicated in block 860. Subsequently, the method 800 loops back to block 804 of FIG. 8, in which the compute device 100 again determines whether to encode data.

If, in block 804, the compute device 100 determines not to encode data (e.g., there is no data available that has not already been encoded), the method 800 advances to block 862 of FIG. 10, in which the compute device 100 determines whether to read data (e.g., to decode data from the memory 104). The compute device 100 may determine to read data in response to receiving a request from an application that produced a read request, in response a request from another compute device (not shown), and/or based on other factors. Regardless, in response to a determination to read data, the method 800 advances to block 864, in which the compute device 100 reads one or more codewords from the memory (e.g., the memory 104). In doing so, and as indicated in block 866, the compute device 100 may read codeword data (e.g., bits) from one or more selected columns of the column addressable memory. In the illustrative embodiment, the compute device 100 reads the codeword data from one or more selected columns of memory that is row and column addressable, as indicated in block 868. As indicated in block 870, the compute device 100 reads codeword data from memory having a three dimensional cross point architecture (e.g., the memory 104).

Figure 11:
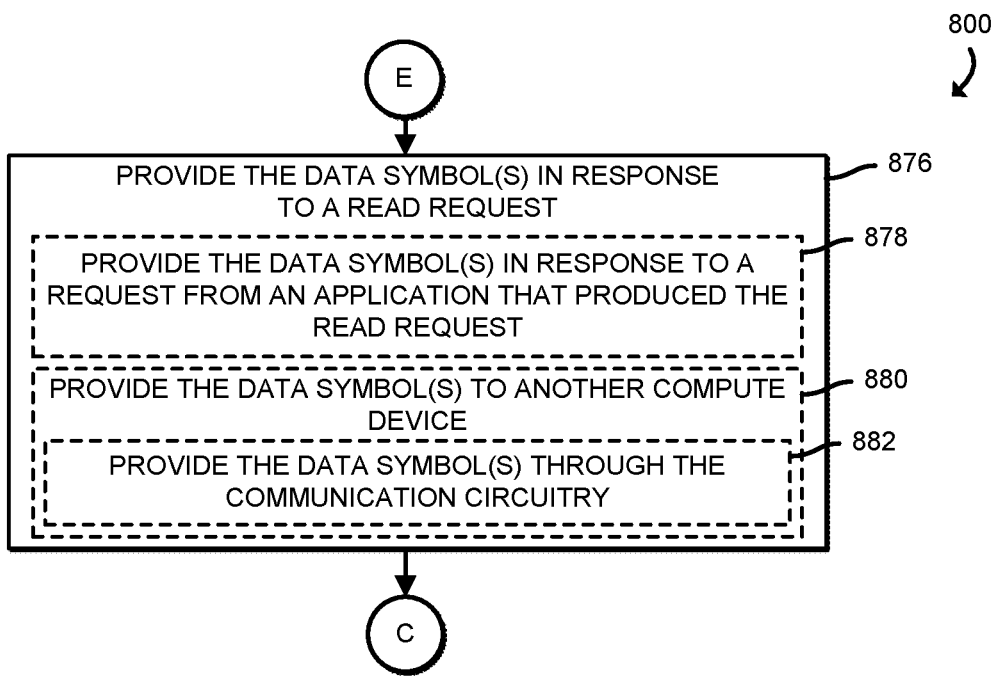

Subsequently, the method 800 advances to block 872, in which the compute device 100 may convert each read codeword to a corresponding data symbol (e.g., letter, number, etc.). In doing so, and as indicated in block 874, the compute device 100, may convert each read codeword to the corresponding data symbol as a function of (e.g., utilizing) a map (e.g., the map that was written to the memory in block 848) that correlates each data symbol with a corresponding codeword. Subsequently, the method 800 advances to block 876 of FIG. 11, in which the compute device 100 may provide the one or more data symbols in response to a read request. In doing so, and as indicated in block 878, the compute device 100 may provide the one or more data symbols in response to a request from an application that produced the read request (e.g., an application executed by the processor 102). As indicated in block 880, the compute device 100 may provide the one or more data symbols to another compute device (not shown). In doing so, the compute device 100 may provide the one or more data symbols using the communication circuitry 122, as indicated in block 882. Subsequently, the method 800 loops back to block 804 of FIG. 8, in which the compute device 100 again determines whether to encode data (e.g., additional data).

EXAMPLES

Illustrative examples of the technologies disclosed herein are provided below. An embodiment of the technologies may include any one or more, and any combination of, the examples described below.

Example 1 includes a device comprising a memory that is column addressable; circuitry connected to the memory, wherein the circuitry is to obtain a data set to encode, wherein the data set is defined by a set of data symbols; determine a set of codewords to encode the data symbols of the data set, including defining each codeword with a set bit distance of at least two from every other codeword in the set of codewords; write the data set to the memory as a function of the determined set of codewords.

Example 2 includes the subject matter of Example 1, and wherein the circuitry is further to determine a frequency of use of each data symbol in the data set; and define the set bit distance between the codewords as a function of the frequency of use of each corresponding data symbol in the data set.

Example 3 includes the subject matter of any of Examples 1 and 2, and wherein to define the set bit distance between the codewords as a function of the frequency of use comprises to define the set bit distance between the codewords in a direct relationship to the frequency of use of each corresponding data symbol in the data set.

Example 4 includes the subject matter of any of Examples 1-3, and wherein to determine a set of codewords to encode the data symbols comprises to associate at least one unique set bit with each data symbol represented in the set of codewords.

Example 5 includes the subject matter of any of Examples 1-4, and wherein to determine a set of codewords to encode the data symbols comprises to concatenate each codeword with itself.

Example 6 includes the subject matter of any of Examples 1-5, and wherein the circuitry is further to write, to the memory, a map that correlates each data symbol with the corresponding codeword from the determined set of codewords.

Example 7 includes the subject matter of any of Examples 1-6, and wherein to write the data set to the memory as a function of the determined set of codewords comprises to write, to the memory, the corresponding codeword for each data symbol present in the data set.

Example 8 includes the subject matter of any of Examples 1-7, and wherein to write the data set to the memory as a function of the determined set of codewords comprises to write, to the memory, the data set as records of a database.

Example 9 includes the subject matter of any of Examples 1-8, and wherein to obtain the data set comprises to obtain a data set defined by data symbols in an alphabet.

Example 10 includes the subject matter of any of Examples 1-9, and wherein to obtain the data set comprises to obtain a data set defined by data symbols in an alphanumeric set.

Example 11 includes the subject matter of any of Examples 1-10, and wherein to obtain the data set comprises to obtain a data set defined by American Standard Code for Information Interchange (ASCII) data symbols.

Example 12 includes the subject matter of any of Examples 1-11, and wherein to obtain the data set comprises to obtain data indicative of a genetic sequence.

Example 13 includes the subject matter of any of Examples 1-12, and wherein to obtain the data set comprises to obtain data indicative of textual data.

Example 14 includes the subject matter of any of Examples 1-13, and wherein the circuitry is further to read codeword data from selected columns of the memory; and convert the read codewords to the corresponding data symbols as a function of a map that correlates each data symbol with the corresponding codeword.

Example 15 includes the subject matter of any of Examples 1-14, and wherein the memory is column addressable and row addressable and has a three dimensional cross point architecture.

Example 16 includes a system comprising a processor; a memory that is column addressable; circuitry connected to the memory, wherein the circuitry is to obtain a data set to encode, wherein the data set is defined by a set of data symbols; determine a set of codewords to encode the data symbols of the data set, including defining each codeword with a set bit distance of at least two from every other codeword in the set of codewords; write the data set to the memory as a function of the determined set of codewords.

Example 17 includes the subject matter of Example 16, and wherein the circuitry is in a memory device.

Example 18 includes the subject matter of any of Examples 16 and 17, and wherein the circuitry is in a storage device.

Example 19 includes a method comprising obtaining, by a device having a memory that is column addressable, a data set to encode, wherein the data set is defined by a set of data symbols; determining, by the device, a set of codewords to encode the data symbols of the data set, including defining each codeword with a set bit distance of at least two from every other codeword in the set of codewords; writing, by the device, the data set to the memory as a function of the determined set of codewords.

Example 20 includes one or more machine-readable storage media comprising a plurality of instructions stored thereon that, in response to being executed, cause a device having a memory that is column addressable to obtain a data set to encode, wherein the data set is defined by a set of data symbols; determine a set of codewords to encode the data symbols of the data set, including defining each codeword with a set bit distance of at least two from every other codeword in the set of codewords; write the data set to the memory as a function of the determined set of codewords.

The invention claimed is:

1. A device comprising:
a memory that is column addressable;
circuitry connected to the memory, wherein the circuitry is to:
obtain a data set to encode, wherein the data set is defined by a set of data symbols;
determine a set of codewords to encode the data symbols of the data set, including defining each codeword with a set bit distance of at least two from every other codeword in the set of codewords;
write the data set to the memory as a function of a determined set of codewords;
determine a frequency of use of each data symbol in the data set; and
define the set bit distance between the codewords as a function of the frequency of use of each corresponding data symbol in the data set.

2. The device of claim 1, wherein to define the set bit distance between the codewords as a function of the frequency of use comprises to define the set bit distance between the codewords in a direct relationship to the frequency of use of each corresponding data symbol in the data set.

3. The device of claim 1, wherein to determine a set of codewords to encode the data symbols comprises to associate at least one unique set bit with each data symbol represented in the set of codewords.

4. The device of claim 1, wherein to determine a set of codewords to encode the data symbols comprises to concatenate each codeword with itself.

5. The device of claim 1, wherein the circuitry is further to write, to the memory, a map that correlates each data symbol with a corresponding codeword from the determined set of codewords.

6. The device of claim 1, wherein to write the data set to the memory as a function of the determined set of codewords comprises to write, to the memory, a corresponding codeword for each data symbol present in the data set.

7. The device of claim 1, wherein to write the data set to the memory as a function of the determined set of codewords comprises to write, to the memory, the data set as records of a database.

8. The device of claim 1, wherein to obtain the data set comprises to obtain a data set defined by data symbols in an alphabet.

9. The device of claim 1, wherein to obtain the data set comprises to obtain a data set defined by data symbols in an alphanumeric set.

10. The device of claim 1, wherein to obtain the data set comprises to obtain a data set defined by American Standard Code for Information Interchange (ASCII) data symbols.

11. The device of claim 1, wherein to obtain the data set comprises to obtain data indicative of a genetic sequence.

12. The device of claim 1, wherein to obtain the data set comprises to obtain data indicative of textual data.

13. The device of claim 1, wherein the circuitry is further to:
read codeword data from selected columns of the memory; and
convert the read codewords to corresponding data symbols as a function of a map that correlates each data symbol with a corresponding codeword.

14. The device of claim 1, wherein the memory is column addressable and row addressable and has a three dimensional cross point architecture.

15. A system comprising:
a processor;
a memory that is column addressable;
circuitry connected to the memory, wherein the circuitry is to:
obtain a data set to encode, wherein the data set is defined by a set of data symbols;
determine a set of codewords to encode the data symbols of the data set, including defining each codeword with a set bit distance of at least two from every other codeword in the set of codewords; and
write the data set to the memory as a function of a determined set of codewords;
determine a frequency of use of each data symbol in the data set; and
define the set bit distance between the codewords as a function of the frequency of use of each corresponding data symbol in the data set.

16. The system of claim 15, wherein the circuitry is in a memory device.

17. The system of claim 15, wherein the circuitry is in a storage device.

18. A method comprising:
obtaining, by a device having a memory that is column addressable, a data set to encode, wherein the data set is defined by a set of data symbols;
determining, by the device, a set of codewords to encode the data symbols of the data set, including defining each codeword with a set bit distance of at least two from every other codeword in the set of codewords;
writing, by the device, the data set to the memory as a function of a determined set of codewords;
determining a frequency of use of each data symbol in the data set; and
defining the set bit distance between the codewords as a function of the frequency of use of each corresponding data symbol in the data set.

19. One or more non-transitory machine-readable storage media comprising a plurality of instructions stored thereon that, in response to being executed, cause a device having a memory that is column addressable to:
obtain a data set to encode, wherein the data set is defined by a set of data symbols;
determine a set of codewords to encode the data symbols of the data set, including defining each codeword with a set bit distance of at least two from every other codeword in the set of codewords;
write the data set to the memory as a function of a determined set of codewords;
determine a frequency of use of each data symbol in the data set; and
define the set bit distance between the codewords as a function of the frequency of use of each corresponding data symbol in the data set.

* * * * *